United States Patent [19]

Godsey et al.

[11] 4,179,172

[45] Dec. 18, 1979

[54] MODULAR HARDWARE PACKAGING APPARATUS

[75] Inventors: Ernest E. Godsey; George W. Hoyle; Rusty S. Christensen, all of Tucson, Ariz.

[73] Assignee: Burr-Brown Research Corporation, Tucson, Ariz.

[21] Appl. No.: 920,671

[22] Filed: Jun. 30, 1978

[51] Int. Cl.² ................................ H05K 1/07
[52] U.S. Cl. ............................ 339/17 LM; 361/413
[58] Field of Search .......... 339/17 L, 17 LM, 17 LC, 339/17 M, 176 MP; 361/399, 413, 415

[56] References Cited

U.S. PATENT DOCUMENTS

| | | | |
|---|---|---|---|
| 2,951,185 | 8/1960 | Buck | 339/17 LM |
| 3,147,404 | 9/1964 | Sinner | 339/17 LM |
| 3,771,101 | 11/1973 | Elkins | 361/413 |

FOREIGN PATENT DOCUMENTS

| | | | |
|---|---|---|---|
| 1143559 | 2/1963 | Fed. Rep. of Germany | 339/17 L |
| 2139701 | 2/1972 | Fed. Rep. of Germany | 339/17 L |
| 170036 | 1/1960 | Sweden | 361/413 |
| 1261239 | 1/1972 | United Kingdom | 339/176 MP |

OTHER PUBLICATIONS

IBM Tech. Discl. Bulletin, Berger et al., vol. 11, No. 7, p. 723, 12-1968.

*Primary Examiner*—Neil Abrams
*Attorney, Agent, or Firm*—Harry M. Weiss

[57] ABSTRACT

This relates to a packaging apparatus for coupling modular hardware (e.g. printed circuit boards) to both the bus of a digital system and to industrial end devices such as relays, thermocouples, etc. A motherboard connected to the rear of a card cage couples a first group of edge connectors on each card to the digital system bus. The motherboard has a plurality of clearance holes therein for providing access to a second group of edge connectors on each card. A dedicated terminal assembly having end device field wiring connected thereto is electrically coupled to the second group of edge connectors of a particular card by either passing a suitable connector attached to the assembly through one of the clearance holes or by coupling the second group to the assembly by a suitable cable which passes through the hole.

10 Claims, 8 Drawing Figures

MODULAR HARDWARE PACKAGING APPARATUS

BACKGROUND OF THE INVENTION

1. Field of the Invention

This invention relates generally to system packaging apparatus and, more particularly, to an apparatus for coupling modular hardware to both the bus of a digital system and to industrial end devices.

2. Description of the Prior Art

Modular hardware is typically coupled to the bus of a digital system through the use of a wire wrap, a ribbon cable, or a printed circuit motherboard with identical edgecard or pin and socket connectors. This technique is used in virtually every minicomputer and microcomputer mainframe and offers the advantages of flexibility and serviceability.

The coupling of this same modular hardware to real, industrial end devices such as relays, thermocouples, etc., has been accomplished in several ways. First, an appropriate termination can be supplied on the modular device itself. Second, the field wiring can be made into a special cable terminating in an appropriate edgecard or pin and socket connector. Third, a suitable termination assembly can be coupled to each end device, which assembly is then coupled to the modular device by means of a special cable. Finally, a suitable termination assembly can be connected directly to the modular device by means of a single edgecard or pin and socket connector.

As the cost of microprocessors continues to decline it is becoming more important to implement cost effective packaging for industrial systems. All of the above described techniques suffer from cost performance problems and are relatively inflexible.

SUMMARY OF THE INVENTION

It is an object of the present invention to provide a cost effective packaging arrangement for electronics hardware which must interface with both industrial end devices and bus oriented digital systems.

It is a further object of the invention that the packaging arrangement require a minimum of hardware to implement and not be labor intensive when implemented at the large system level.

Finally, it is an object of the invention to provide a packaging arrangement which permits replacement of the modular electronics without disturbance of the field wiring.

According to a broad aspect of the invention there is provided an apparatus for electrically coupling modular electronic hardware to a digital system bus and to an industrial end device, said modular hardware including first and second groups of contacts, said apparatus comprising of first connector means electrically coupled to said bus for engaging said first group of contacts from a first direction and second connector means electrically coupled to said end device for engaging said second group of contacts from said first direction.

The foregoing, and other objects, features and advantages will be apparent from the following, more detailed, description of preferred embodiments taken in conjunction with the accompanying drawings in which:

DESCRIPTION OF THE PREFERRED EMBODIMENTS

Figure 1:
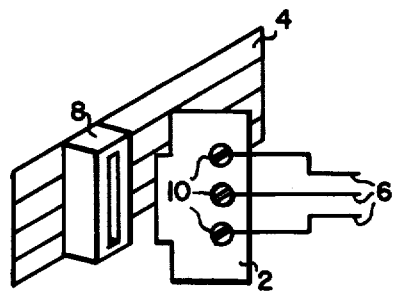
FIGS. 1, 2, 3 and 4 illustrate different known techniques got coupling modular hardware to industrial end devices.

FIG. 1 illustrates a first known technique of connecting modular hardware, shown here as a printed circuit (PC) board 2, to a digital system bus 4 and to an industrial end device (not shown) via field wiring 6, which field wiring is connected directly to the end device. A connector 8 is employed to couple the PC board to bus 4. Terminations 10 are provided on the PC board for connection to the field wiring.

While this technique is relatively inexpensive, it suffers from several disadvantages. First, if it becomes necessary to replace the PC board, then all field wire connections must be removed. Second, to insert calibration signals or replace the field devices with test equipment, the field connections must be individually removed. Both of these disadvantages result in unwanted down time. Finally, this approach permits potentially hazardous field wiring to rest in close proximity to the device electronics.

Figure 2:
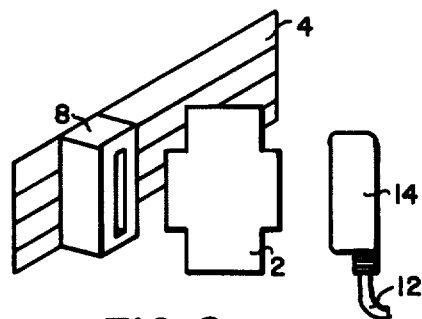

FIG. 2 illustrates a second known technique of connecting a PC board 2 to a digital bus 4 (via connector 8) and to an industrial end device (not shown). In this case, a cable 12, comprised of the field wiring, and an appropriate edge card or pin and socket connector 14 coupled to cable 12 are employed. This is a relatively expensive solution and likewise suffers from certain disadvantages. First, replacing PC board 2 would require that field connector 14 be removed. Second, to repair or replace any specific end device connection would require that connector 14 be removed and reworked. As in the case of the first approach, the disadvantages associated with this second known technique result in the loss of valuable time.

Figure 3:
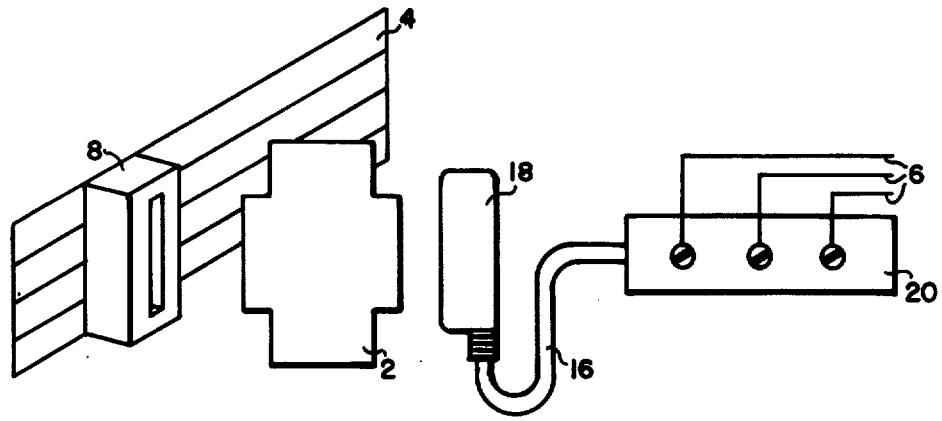

A third known technique is shown in FIG. 3. Again, the PC board 2 is coupled to digital bus 4 by means of a connector 8. A termination assembly 20 having field wires 6 coupled thereto is connected to PC board 2 by means of a special cable 16 and connector 18. This is still a relatively high cost solution, and even though the field termination offered may be acceptable to industrial users, cable 16 and connector 18 linking PC board 2 with termination assembly 20 may have to be removed to replace the PC board.

Figure 4:
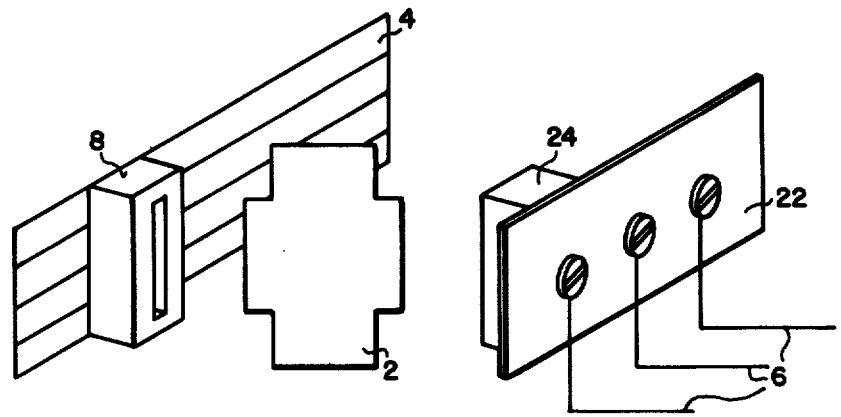

Finally, a fourth known technique is illustrated in FIG. 4. PC board 2 is again coupled to digital bus 4 via connector 8. However, in this case a suitable termination assembly 22 having field wires 6 coupled thereto is directly connected to the PC board 2 via a single edgecard or pin and socket assembly 24. While less expensive to employ, this technique results in low device density along the bus. Furthermore, the termination assembly itself may have to be removed to replace the PC board 2.

The inventive arrangement, to be described in detail hereinbelow, provides a cost effective solution to the problem and does not require any of the field wiring to be disturbed in order to replace the PC board.

Figure 5:
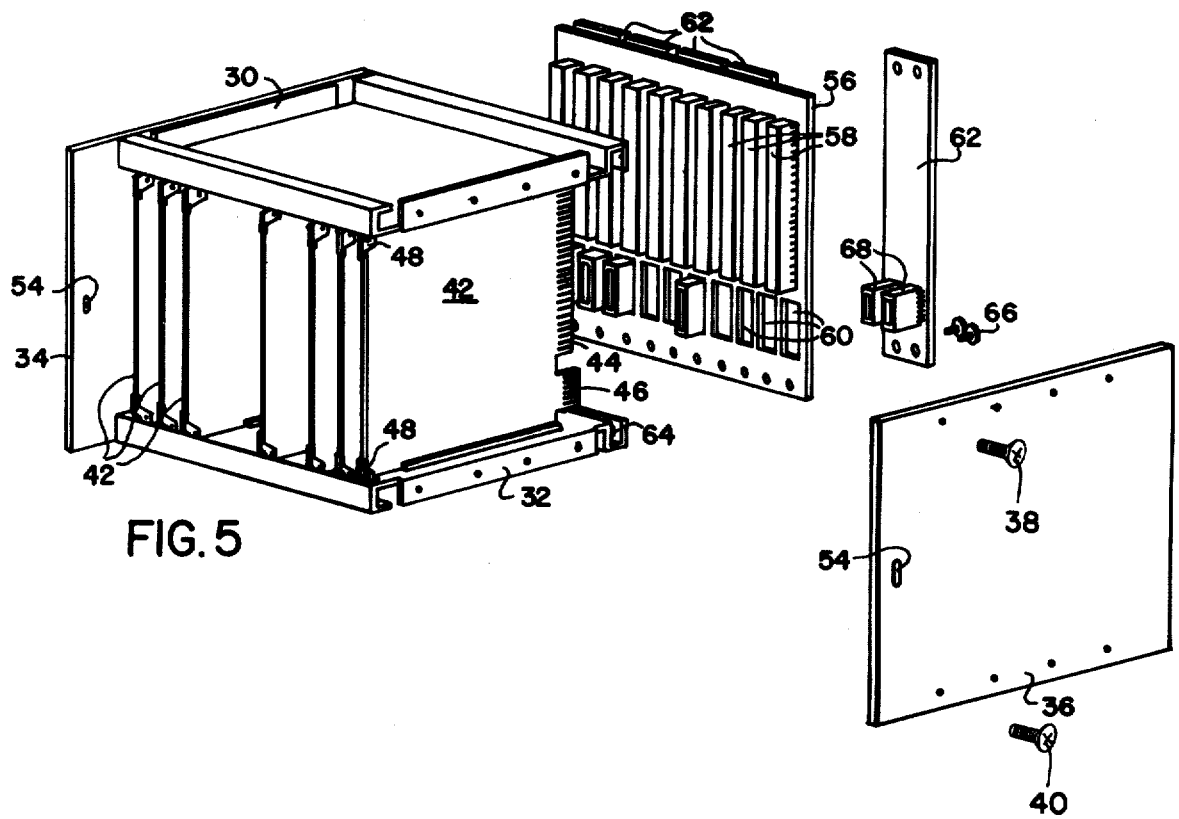
FIG. 5 is an exploded front view of the inventive packaging arrangement.

FIG. 5 is an exploded front view of the inventive packaging apparatus for coupling modular hardware to both the bus of a digital system and to industrial end devices. A card cage comprises, in part, an upper support member 30 and a lower support member 32, both of which are secured to side support members 34 and 36 by means of, for example, screws 38 and 40. Only two such securing screws are shown for the sake of simplicity.

The modular hardware is shown as a plurality of printed circuit cards 42 each of which includes two separate groups of contacts 44 and 46. Both groups of contacts are arranged on the same edge so that they may both be engaged or disengaged by a single movement of the card. Edge contacts 44 are intended to couple card 42 to the digital system bus while edge contacts 46 are employed to connect card 42 to an end device such as a relay, thermocouple, or pressure transmitter.

Retaining levers 48 coupled to each of the cards 42 and a retaining bar (not shown) which engages apertures 54 in the side walls, assist in securing cards 42 in their proper positions within the card cage.

A motherboard 56 has mounted thereon a plurality of edge connectors 58 and contains a plurality of clearance apertures 60 therein. Edge connectors 58, when coupled to cards 42 via edge contacts 44, connect each of the cards 42 to the digital system bus.

Dedicated termination assemblies 62 can be attached to the rear of the card cage by engaging apertures in the rear portions of the upper and lower support members, such as is shown at 64, with fasteners 66 which pass through the termination assembly 62. At least one edge connector 68 coupled to assembly 62 and extending therefrom passes through clearance aperture 60 in motherboard 56 and engages contacts 46 on card 42.

Figure 6:
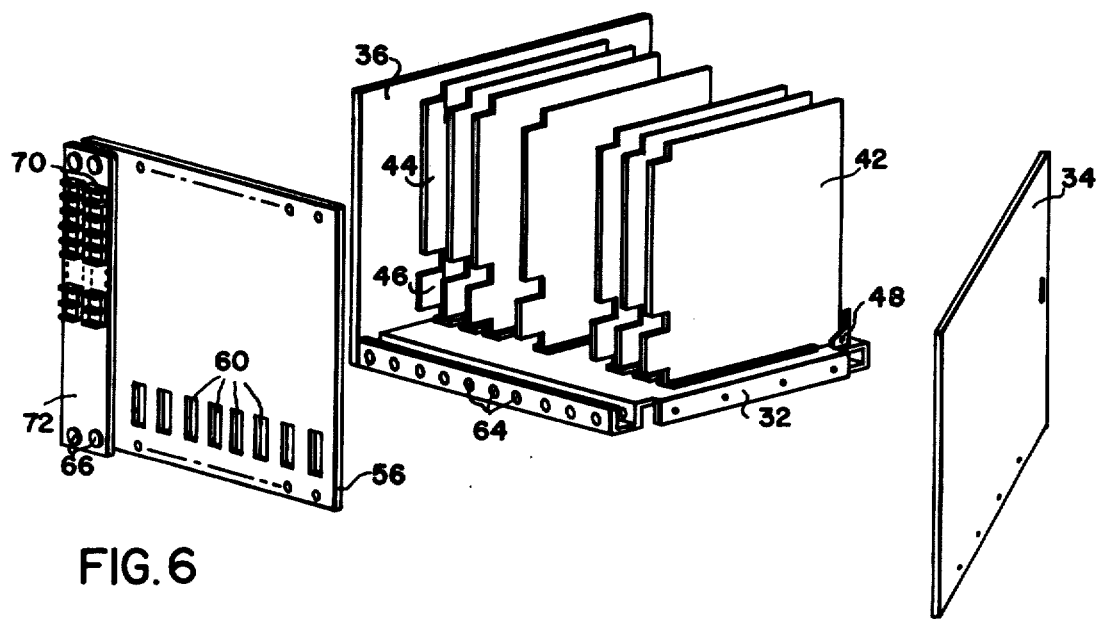
FIG. 6 is an exploded rear view of the arrangement shown in FIG. 5.

FIG. 6 is an exploded rear view of the packaging apparatus shown in FIG. 5. For clarity, the top support member 30 (FIG.5) is omitted in FIG. 6. Further, like elements are denoted by like numerals and, for the most part, will not be discussed again in any detail.

Referring to FIG. 6, it can be seen that terminal blocks 70 are coupled to the rear portions of dedicated termination assemblies 62. Field wires can then be coupled to the individual terminals on terminal blocks 70.

The base 72 of the dedicated termination assembly 62 is, for example, printed circuit board material having a conductor pattern applied thereto using well known printed circuit techniques, which pattern electrically couples the terminals of block 70 to appropriate contact terminals of edge connectors 68. Thus, by connecting the field wires (not shown) to the terminals of assemblies 70 and by engaging edge contacts 46 with edge connectors 68, industrial end devices can be connected to the electronics on cards 42.

It should be clear that to replace any of the cards 42, it is only necessary to remove retaining bar 50, withdraw the old card and substitute a new one therefor. It is not necessary to disturb any of the field wires.

Figure 7:
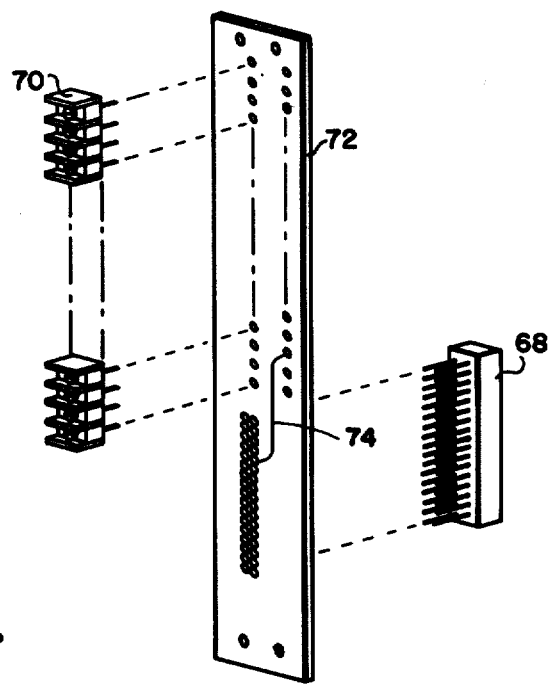
FIG. 7 is an exploded view of a dedicated termination assembly used in the arrangement of FIGS. 5 and 6.

FIG. 7 is an exploded view of the dedicated termination assembly 62. Both terminal block 70 and edge connector 68 are soldered or otherwise coupled to printed circuit board material 72 which has a conductor pattern thereon for electrically coupling the terminals of block 70 to appropriate contacts of edge connector 68. For clarity, only one such conductor 74 is shown.

Figure 8:
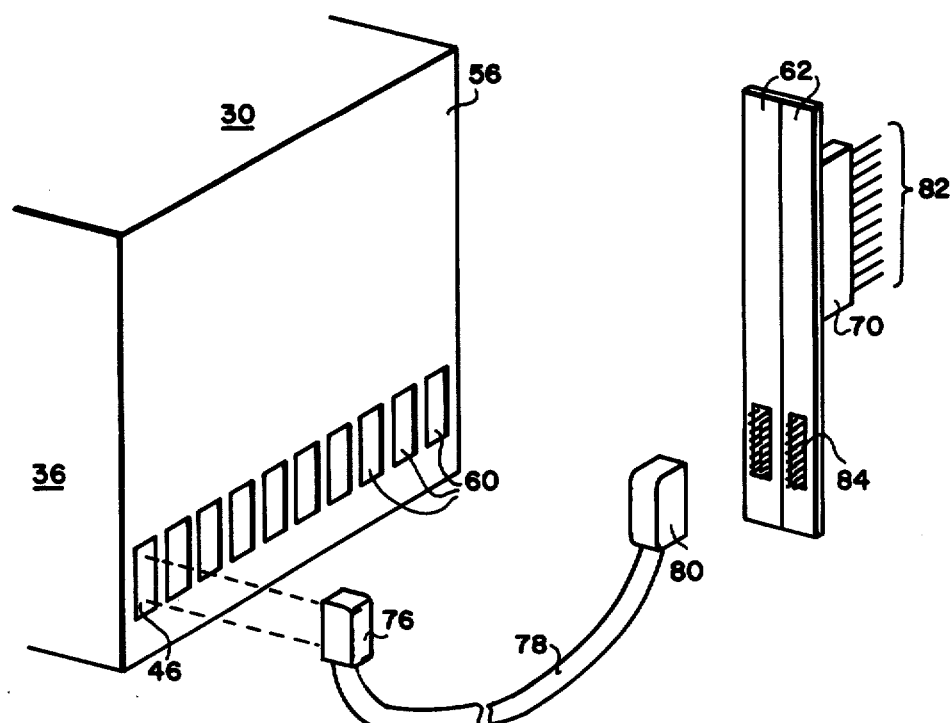
FIG. 8 illustrates a second embodiment of the inventive packaging arrangement.

In a second embodiment, the dedicated termination assembly may be mounted remotely from and independently of the remainder of the card cage. FIG. 8 shows such an arrangement. Field wires 82 are coupled to termination block 70 of dedicated termination assembly 62 which is mounted remotely from and independently of the remainder of the card cage. Clearance apertures 60 in motherboard 56 permit access to edge contacts 46. A suitable cable 78, which is terminated in connectors 76 and 80, is used to couple the printed circuit board cards to the dedicated termination assembly 62 and thus to the industrial end device (not shown) via terminal block 70 and field wires 82. Connector 76 is an edge connector which engages edge contacts 46 on the card. Connector 80 is any suitable connector which mates with connector 84 on assembly 62.

The dedicated termination assemblies 62, while remote, may be conveniently mounted, e.g. capable of being accessed from the same side as are the cards in the card cage.

While the two embodiments have been described as separate arrangements, it should be clear that nothing prevents a hybrid arrangement wherein some dedicated termination assemblies are mounted on the motherboard (as in the first embodiment) and other dedicated termination assemblies are remotely mounted (as in the second embodiment). The first represents the lowest cost termination while the second provides maximum density of cards in the card rack and flexibility in locating the dedicated termination assemblies. However, in both arrangements, the cards may be removed without disturbing the end device field wiring.

While the invention has been particularly shown and described with reference to preferred embodiments thereof, it should be understood by those skilled in the art that the foregoing and other changes in form and details may be made therein without departing from the field and scope of the invention.

What is claimed is:

1. Apparatus for electrically coupling modular electronic hardware to a digital system bus and to an industrial end device, said modular hardware including first and second groups of contacts, said apparatus comprising:

a motherboard electrically coupled to said bus and having at least one connector mounted thereon for engaging said first group of contacts from a first direction, said motherboard having at least one clearance hole therein; and at least one termination assembly having at least one connector thereon which electrically couples said second group of contacts from said first direction and through said at least one clearance hole, said termination assembly comprising a printed circuit board having a conductor pattern thereon and at least one terminal block thereon for coupling to said end device, said conductor pattern connecting terminals of said terminal block to said at least one connector of said termination assembly.

2. Apparatus according to claim 1 further including a housing into which said modular hardware is inserted.

3. Apparatus according to claim 2 wherein said motherboard is coupled to said housing.

4. Apparatus according to claim 3 wherein said termination assembly is mounted on said housing and said at least one connector on said termination assembly passes through said clearance hole.

5. Apparatus according to claim 3 wherein said termination assembly is mounted remotely from said housing and said at least one connector on said termination assembly is coupled to said second group of contacts by a suitable cable, said cable terminated in a connector which engages said second group of contacts through said clearance hole.

6. Apparatus according to claim 3 wherein said terminal block is mounted on one side of said printed circuit board and said at least one connector of said termination assembly is mounted on an opposite side of said printed circuit board.

7. Apparatus according to claim 6 wherein said modular hardware comprises printed circuit boards and wherein said housing is a card cage to the rear of which is mounted said motherboard.

8. Apparatus according to claim 7 wherein said first and second groups of contacts comprise a plurality of edge contacts on said printed circuit boards.

9. Apparatus according to claim 8 wherein said at least one connector on said motherboard is an edge connector.

10. Apparatus according to claim 9 wherein said at least one connector on said termination assembly is an edge connector.